(12) United States Patent
Hasegawa

(10) Patent No.: US 6,941,112 B2
(45) Date of Patent: Sep. 6, 2005

(54) GAIN CONTROL AMPLIFICATION CIRCUIT AND TERMINAL EQUIPMENT HAVING THE SAME

(75) Inventor: Osamu Hasegawa, Tokyo (JP)

(73) Assignee: NEC Corporation, Tokyo (JP)

( * ) Notice: Subject to any disclaimer, the term of this patent is extended or adjusted under 35 U.S.C. 154(b) by 783 days.

(21) Appl. No.: 09/894,122

(22) Filed: Jun. 29, 2001

(65) Prior Publication Data

US 2002/0006776 A1 Jan. 17, 2002

(30) Foreign Application Priority Data

Jul. 14, 2000 (JP) ..................................... 2000-213884

(51) Int. Cl.[7] .............................................. H03G 3/20
(52) U.S. Cl. ........................... 455/69; 455/68; 455/522
(58) Field of Search ............................. 455/69, 68, 75, 455/522

(56) References Cited

FOREIGN PATENT DOCUMENTS

| GB | 2 261 335 A | 5/1993 |
|----|-------------|--------|
| GB | 2 271 231 A | 4/1994 |
| GB | 2 311 671 A | 10/1997 |
| GB | 2 317 283 A | 3/1998 |
| GB | 2 344 007 A | 5/2000 |
| JP | 64-90689 | 4/1989 |
| JP | 8-111620 | 4/1996 |
| JP | 09-199963 A | 7/1997 |
| JP | 09-321637 A | 12/1997 |
| JP | 09-331222 A | 12/1997 |
| JP | 10-107654 A | 4/1998 |
| JP | 10-112682 | 4/1998 |
| JP | 11-251934 A | 9/1999 |
| JP | 11-355078 A | 12/1999 |

*Primary Examiner*—William J. Deane, Jr.
(74) *Attorney, Agent, or Firm*—Sughrue Mion, PLLC (57) ABSTRACT

A gain control amplification circuit of this invention has a gain control amplification section which has at least two stages and is arranged in the transmission circuit of a terminal equipment for communicating with a base station. The gain control amplification section includes gain control amplifiers of IF-GCA and RF-GCA arranged on the input side (former stage) and output side (latter stage) of an up converter in the transmission circuit. The gains of the gain control amplifiers are individually controlled by a control section.

12 Claims, 6 Drawing Sheets

GAIN CONTROL AMPLIFICATION CIRCUIT AND TERMINAL EQUIPMENT HAVING THE SAME

BACKGROUND OF THE INVENTION

1. Field of the Invention

The present invention relates to a gain control amplification circuit and, more particularly, to a wide-range gain control amplification circuit which has a plurality of stages of gain control amplifiers and can control the transmission output to a predetermined output value, and a terminal equipment having the circuit.

2. Description of the Prior Art

Recent radio communication requires high-speed communication and effective use of frequency resources. For these purposes, use of CDMA (Code Division Multiple Access) has been examined. In the CDMA, data are multiplexed and transmitted to effectively use the available frequency range.

The CDMA also requires control of the transmission power in a wide range to expand the communication area.

Figure 1:
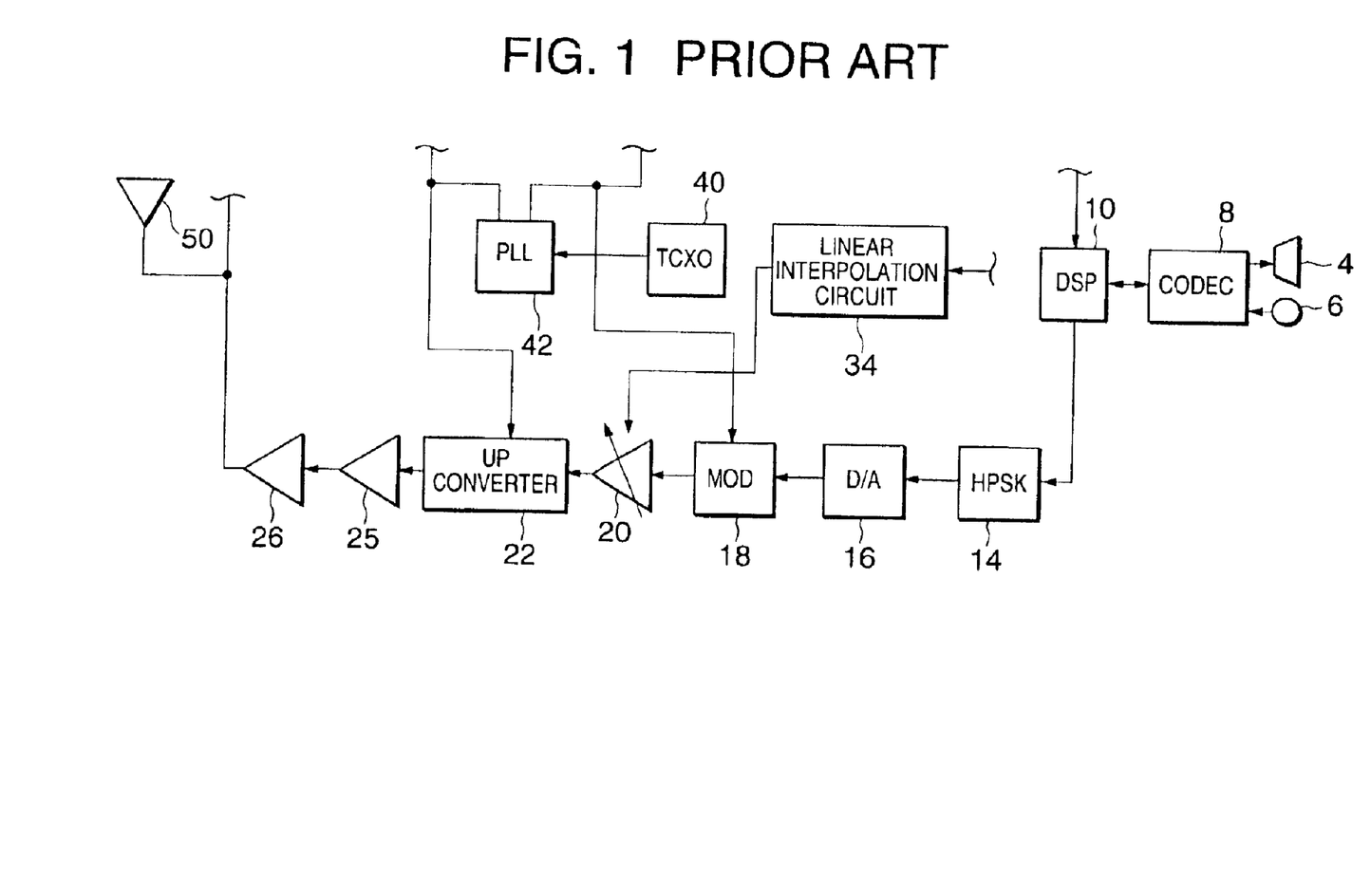
FIG. 1 is a block diagram schematically showing the arrangement of a prior art embodiment.

FIG. 1 shows a conventional gain amplification circuit. In the conventional gain amplification circuit, two gain amplifiers are arranged at the former and latter stages before an antenna 50 to widen the transmission range. More specifically, a gain control amplifier (IF-GCA) 20 capable of gain control is provided at the former stage, and a gain amplifier 25 having a fixed gain is arranged at the latter stage. The gain of the gain control amplifier 20 at the former stage is controlled by a control means and further amplified by the gain amplifier 25 at the latter stage, thereby obtaining a desired transmission power.

That is, a voice (analog) signal input from a microphone 6 is converted into a digital signal by a codec 8, encoded by a DSP 10 on the basis of an algorithm such as GSM-AMR as a codec scheme, and the transmission frame format, and input to an HPSK circuit 14. The transmission data HPSK-modulated by the HPSK circuit 14 is converted from the digital signal to an analog baseband signal by a D/A converter 16.

The converted analog baseband signal is modulated into the IF band by an MOD 18 on the basis of an Lo2 from a PLL 42. The IF-modulated signal is amplified to a predetermined level by the IF-GCA 20 controlled by a linear interpolation circuit 34 at the former stage. The IF-modulated signal amplified here is converted into a transmission frequency (RF-modulated signal) by an up converter 22 on the basis of an Lo1 from the PLL 42. The RF-modulated signal is amplified by the fixed gain of the gain amplifier 25 and power amplifier 26, supplied to the antenna 50, and transmitted into air.

In a telephone of CDMA scheme, since the reception intensity at the base state is constant, the transmission output from the terminal equipment is increased/decreased. When the communication area expands, the amplification width of the transmission output value required by the terminal equipment must be made large. However, the amplification width of the gain control amplifier is limited. A gain control amplifier of a single stage has a narrow range and therefore cannot cope with control based on the amplification request from a base station in a wide area.

That is when the gain of the gain amplifier 25 installed at the latter stage is increased, the gain amplifier cannot cope with a small transmission output when, e.g., the device is near the base station. Conversely, when the gain of the gain amplifier 25 is made small, the gain control amplifier cannot amplify the power to a necessary transmission output when, e.g., the device is far from the base station.

In addition, a gain range that provides the best characteristics in the characteristics of each GCA cannot be designated.

Furthermore, when the transmission output is gradually decreased, to improve the SNR, it is advantageous to decrease the gain of the GCA at the latter stage and then decrease the gain of the GCA at the former stage. However, the gain control amplifiers cannot be individually controlled.

SUMMARY OF THE INVENTION

The present invention has been to solve the above problems in the prior art, and has as its object to provide a wide-range gain control amplification circuit which has a plurality of stages of gain control amplifiers and can control the transmission output to a predetermined output value, and a terminal equipment having the circuit.

A gain control amplification circuit according to the present invention is a transmission circuit which incorporates no feedback circuit and ensures a desired gain control range using a gain control amplification section having two stages particularly in a CDMA (Code Division Multiple Access) cellular phone or the like, in which a plurality of gain control amplifiers (to be referred to as GCAs (Gain Control Amplifiers) hereinafter) for amplifying the transmission output value are independently controlled.

More specifically, the present invention has the following aspects.

(1) The gain control amplification circuit is arranged in a transmission circuit and has a gain control amplification section having two stages in which the gains of a plurality of gain control amplifiers are respectively controlled.

(2) The gains of the plurality of gain control amplifiers are individually controlled. Hence, the gain control amplifiers of two stages can be individually set to desired gains, and a gain control amplification circuit having a wide range and linear characteristic can be implemented.

(3) A gain control amplification circuit for a terminal equipment in a radio communication system which executes communication between a base station and the terminal equipment has a gain control amplification section having two stages, in which the gain control amplification section is controlled to set the transmission output value to a predetermined value on the basis of the reception level of a reception signal transmitted from the base station and received by the terminal equipment or on the basis an instruction from the base station.

(4) A gain control amplification circuit for a terminal equipment in a radio communication system which executes communication between a base station and the terminal equipment has a gain control amplification section having two stages of gain control amplifiers individually connected to control means, in which the gain control amplifiers are individually controlled to set the transmission output value to a predetermined value on the basis of the reception level of a reception signal transmitted from the base station and received by the terminal equipment or on the basis an instruction from the base station.

(5) Of the gain control amplifiers, the range of the gain control amplifier at the latter stage is set wider than that of the gain control amplifier at the former stage.

(6) When the transmission output is to be reduced, the gain of the gain control amplifier at the latter stage is reduced first. This satisfactorily copes with noise in reducing the transmission output.

(7) The control means is a linear interpolation circuit.

(8) In the linear interpolation circuit, a predetermined portion of the linear characteristic is used by each gain control amplifier, so an excellent linear characteristic can be obtained.

(9) The predetermined portion of the linear characteristic is set on the basis of the SNR of the transmission output. This can suppress noise.

(10) The control means is a storage means which stores a conversion value between the level of the reception signal and a gain corresponding to the level.

(11) The gain control amplifiers of two stages are arranged on the input and output sides of an up converter in the transmission circuit.

(12) The gain control amplification circuit uses gain control amplifiers of two or more stages.

When gain control amplifiers of multiple stages are used, a wider range can be obtained, and a satisfactory linearity can be obtained.

(13) The radio communication system uses the CDMA (Code Division Multiple Access) communication scheme.

(14) The terminal equipment for the radio communication system incorporates the gain control amplification circuit.

As is apparent from the above aspects, according to the present invention, a gain control amplification circuit having a wide gain range can be implemented using a gain control amplification section with two stages. In addition, when the control range is separated, and the respective gain control amplifiers are independently controlled, the SNR of the transmission output can be improved.

This is because the gain control amplifiers have separate control means such as linear interpolation circuits and can be independently controlled for a desired transmission output value, i.e., the gain control amplifier at the latter stage can be controlled by a circuit for a larger transmission output while the gain control amplifier at the former stage can be controlled by a circuit for a smaller transmission output.

Furthermore, in the transmission circuit which ensures a transmission output control range using the gain control amplifiers of two stages, the linear interpolation circuit can also easily be implemented.

This is because the gain control amplifiers have separate linear interpolation circuits, and when only an arbitrary gain range of a linear region is to be used, only linear interpolation table values at only two points need be stored to interpolate the section between the two points, so the circuit is simplified.

The above and many other objects, features and advantages of the present invention will become manifest to those skilled in the art upon making reference to the following detailed description and accompanying drawings in which preferred embodiments incorporating the principle of the invention are shown by way of illustrative examples.

DETAILED DESCRIPTION OF THE PREFERRED EMBODIMENTS

Preferred embodiments of the present invention will be described below with reference to the accompanying drawings.

The schematic arrangement of a gain control amplification circuit according to the first embodiment of the present invention will be described with reference to FIG. 2.

Figure 2:
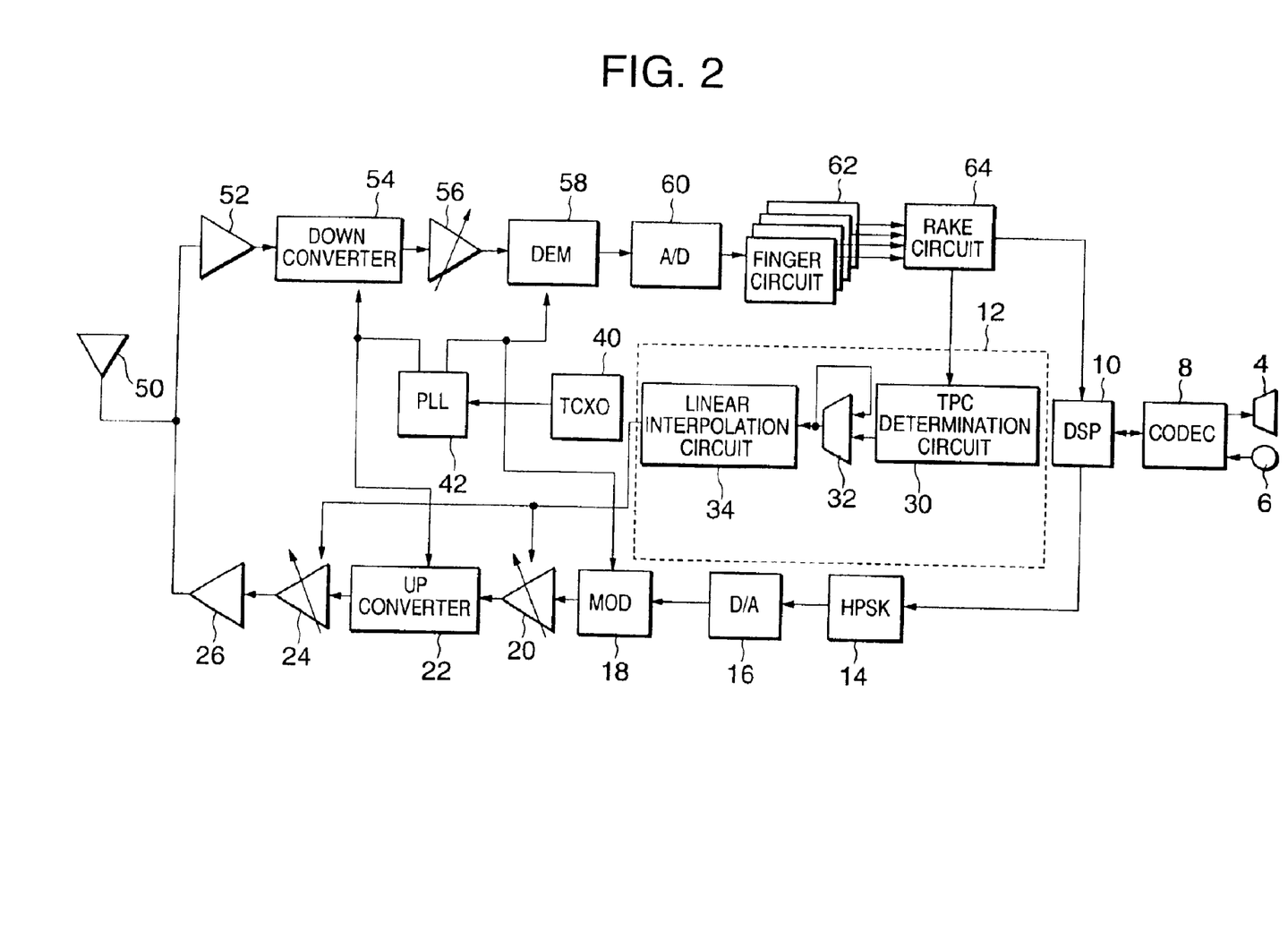
FIG. 2 is a block diagram schematically showing the arrangement of a gain control amplification circuit according to an embodiment of the present invention.

The circuit shown in FIG. 2 is the circuit of a CDMA radio device (terminal equipment) using a transmission/reception heterodyne scheme. The overall circuit arrangement of the terminal equipment will be described first.

An antenna 50 is connected to an LNA (Low Noise Amplifier) 52 to amplify an input reception signal. The output terminal of the LNA 52 is connected to a down converter 54 for converting the amplified reception signal into an intermediate frequency (to be referred to as an IF hereinafter).

The output terminal of the down converter 54 is connected to a reception section gain control amplifier (to be referred to as an RX-GCA hereinafter) 56 for amplifying the IF signal output from the down converter 54 to a predetermined level. The output terminal of the RX-GCA 56 is connected to a DEM (demodulator) 58 for demodulating the signal into a baseband signal. The analog baseband signal output from the DEM 58 is converted into a digital signal by an A/D converter 60.

A temperature-compensated quartz oscillator (to be referred to as a TCXO hereinafter) 40 is connected to a PLL (Phase Locked Loop) 42. The PLL 42 generates a local signal (to be referred to as an Lo1 hereinafter) for an up converter 22 and down converter 54 and a local signal (to be referred to as an Lo2 hereafter) for a MOD (modulator) 18 and DEM 58 with reference to the TCXO 40, and is connected to the up converter 22, down converter 54, MOD 18, and DEM 58.

The reception baseband signal converted into a digital signal by the A/D converter 60 is input to a finger circuit 62 and despread. The output terminal of the finger circuit 62 is connected to a RAKE circuit 64. The RAKE circuit 64 weights and synthesizes the output data from the respective fingers of the finger circuit 62 to generate demodulated data and TCP data.

The demodulated data generated by the RAKE circuit 64 is input to a DSP (Digital Signal Processor) 10 and decoded by the DSP 10. The output from the DSP 10 is input to a codec 8. The signal is demodulated into an analog signal by the codec 8 and output from a speaker 4 as voice.

The TCP data generated by the RAKE circuit 64 is input to a GCA control circuit 12 serving as a control means. Details of the GCA control circuit 12 will be described next. The GCA control circuit 12 comprises a TCP determination circuit 30 serving as a determination means, an adder 32 serving as a calculation means, and a linear interpolation circuit 34 serving as a control voltage generation means. The TCP data is input to the TCP determination circuit 30. The output from the TCP determination circuit 30 is input to the adder 32 and added to the current transmission output value. The output value added by the adder 32 is input to the linear interpolation circuit 34.

The output terminal of the linear interpolation circuit 34 is commonly connected to the gain control terminal of an RF-GCA 24 and that of an IF-GCA 20. The linear interpolation circuit 34 controls the RF-GCA 24 and IF-GCA 20.

An analog signal input from a microphone 6 is input to the codec 8, converted into a digital signal by the codec 8, and input to the DSP 10. The DSP 10 encodes the digital signal and inputs the signal to an HPSK circuit 14. The transmission data HPSK-modulated by the HPSK circuit 14 is input to a D/A converter 16.

The D/A converter 16 converts the digital signal into an analog baseband signal. The analog baseband signal is input to the MOD 18 to be modulated into the IF band. The output terminal of the MOD 18 is connected to the IF-GCA 20 for amplifying the signal to a predetermined level. The output terminal of the IF-GCA 20 is connected to the up converter 22 for converting the signal into a transmission frequency (RF: Radio Frequency).

The output terminal of the up converter 22 is connected to the RF-GCA 24 for converting the signal to a predetermined level. The output terminal of the RF-GCA 24 is connected to a power amplifier 26 for further amplifying the signal to the transmission output level. The power amplifier 26 is connected to the antenna 50 for transmitting the signal into air.

The operation of the circuit shown in FIG. 2 will be described next.

A reception signal input from the antenna 50 is amplified by the LNA 52. The amplified reception signal is converted into the intermediate frequency (IF) by the down converter 54 on the basis of the Lo1 that is generated by the PLL 42 using the TCXO 40 as a reference clock. The reception signal converted into the intermediate frequency is gain-controlled by the RX-GCA 56 such that the input level of the A/D converter 60 becomes constant, and then demodulated into an analog baseband signal by the DEM 58 on the basis of the Lo2 that is generated by the PLL 42 using the TCXO 40 as a reference clock.

The analog baseband signal is converted into a digital signal by the A/D converter 60 and input to the finger circuit 62. The finger circuit 62 executes despreading for each finger, and the despread data is output to the RAKE circuit 64. The RAKE circuit 64 weights and synthesizes the output data from the respective fingers of the finger circuit 62 with reference to, e.g., the reception field value or SNR (Signal to Noise Ratio) to generate voice demodulated data and TCP data.

The voice demodulated data is input to the DSP 10, decoded by the DSP 10 on the basis of an algorithm such as GSM-AMR as the scheme of the codec, and output to the codec 8. The digital signal is converted into an analog signal by the codec 8 and sent to the speaker 4 so that voice is output from the speaker 4.

The TCP data is input to the GCA control circuit 12. The GCA control circuit 12 decodes the TCP data and controls the IF-GCA 20 and RF-GCA 24.

A voice signal (analog) signal input from a microphone 6 is converted into a digital signal by the codec 8, encoded by the DSP 10 on the basis of an algorithm such as GSM-AMR as a codec scheme, and the transmission frame format, and input to the HPSK circuit 14. The transmission data HPSK-modulated by the HPSK circuit 14 is converted from the digital signal to an analog baseband signal by the D/A converter 16. The converted analog baseband signal is modulated into the IF band by the MOD 18 on the basis of the Lo2 from the PLL 42.

The IF-modulated signal is amplified to a predetermined level by the above-described IF-GCA in accordance with a gain designated by the GCA control circuit 12. The amplified IF-modulated signal amplified is converted into a transmission frequency (RF-modulated signal) by the up converter 22 on the basis of Lo1 from the PLL 42. The RF-modulated signal is further amplified to a predetermined level by the RF-GCA 24 in accordance with the gain designated by the GCA control circuit 12 and the fixed gain of the power amplifier 26, supplied to the antenna 50, and transmitted into air.

The GCA control circuit 12 will be described next in detail. When TCP data is input from the RAKE circuit 64 to the TCP determination circuit 30 in the GCA control circuit 12, the TCP determination circuit 30 executes determination in accordance with a predetermined protocol logic value, e.g., "1 Db up" for TCP data "00", "1 Db down" for "11", or "hold" otherwise.

The result determined by the TCP determination circuit 30 is input to the adder 32 and added to the current output value. For example, when the current transmission output value is "+10 dBm", and the TCP determination result is "+1 Db up", the next SLOT transmission output value is determined as "+11 dBm". The transmission output value output from the adder 32 is input to the linear interpolation circuit 34.

Figure 7:
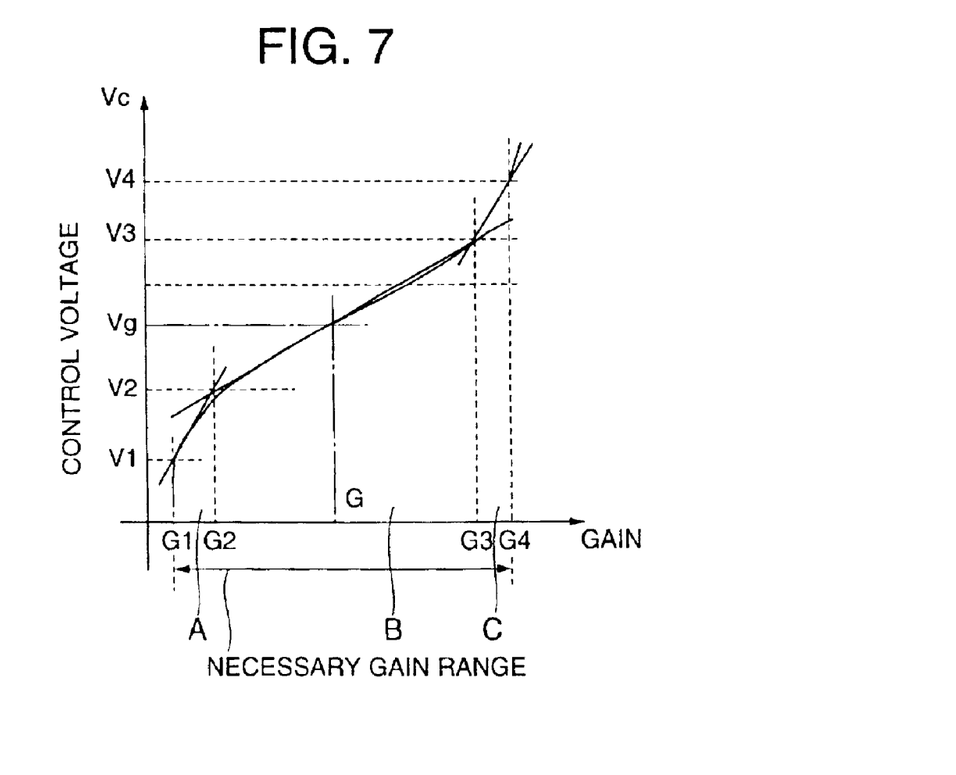
FIG. 7 is a graph showing the gain vs. Vc characteristic of a GCA.

The operation of a general linear interpolation circuit will be described here. For example, to control a GCA having a gain vs. Vc characteristic as shown in FIG. 7, the range is divided into gain ranges (A, B, and C in FIG. 7) that can be approximated by a linear equation, and the gains (G1, G2, G3, and G4) at the boundaries and Vc (V1, V2, V3, and V4) corresponding to the gains are stored as table values for linear interpolation. When, e.g., a gain value G in the region B is designated, a voltage Vg is given by $$Vg=(V3-V2)(G-G2)/(G3-G2)+V2$$

The calculated voltage value Vg is sent to the IF-GCA 20 and RF-GCA 24 to control the transmission output to the desired value.

Figure 3:
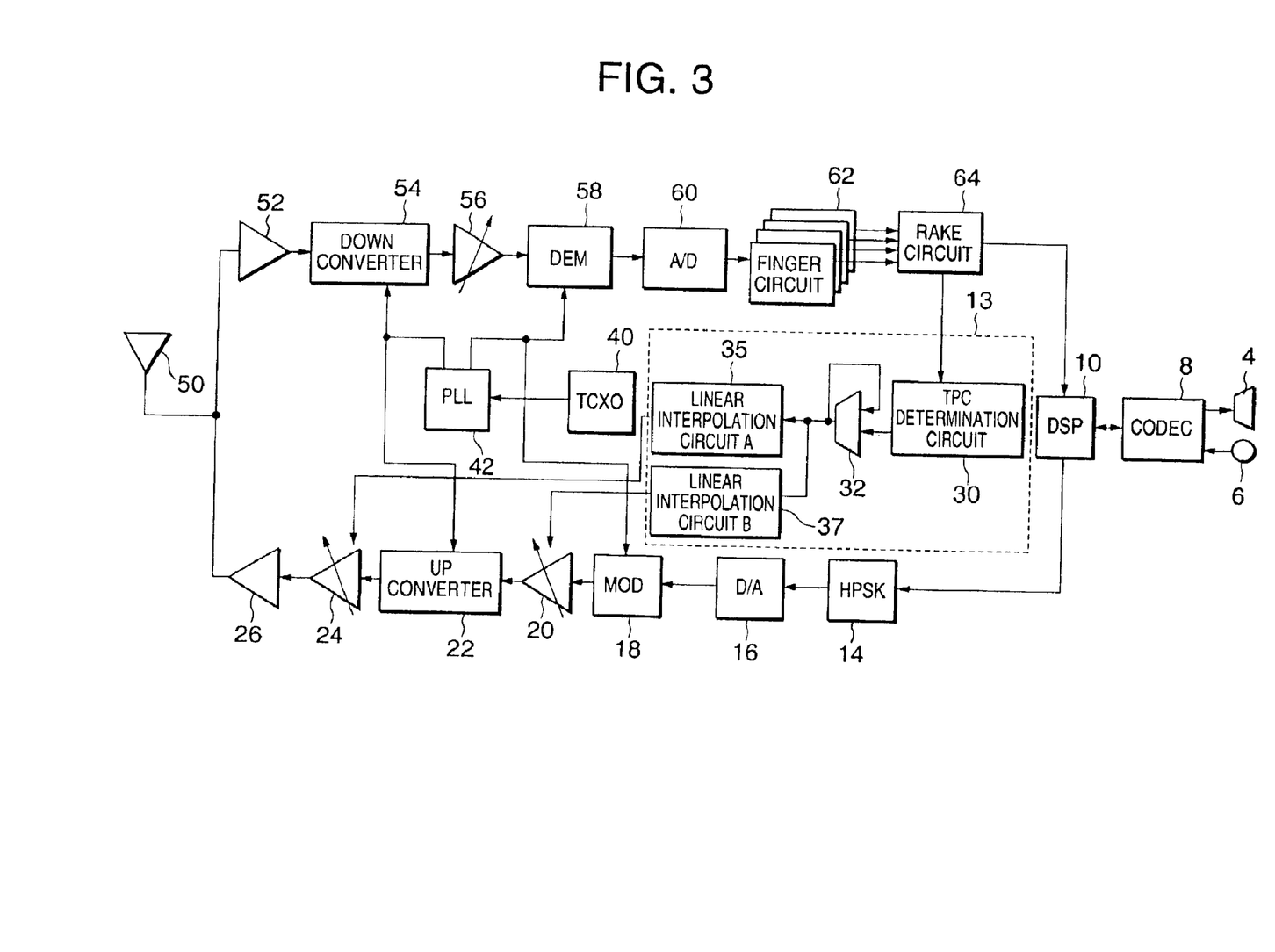
FIG. 3 is a block diagram schematically showing the arrangement of a gain control amplification circuit according to another embodiment of the present invention.

The second embodiment of the present invention will be described next with reference to FIG. 3.

The same reference numerals as in the first embodiment described above with reference to FIG. 2 denote the same components in the second embodiment, and a detailed description thereof will be omitted.

The reception circuit system from an antenna 50 to a RAKE circuit 64 is almost the same as in the first embodiment, though a GCA control circuit 13 related to an IF-GCA 20 and RF-GCA 24 is different from that in the first embodiment.

The GCA control circuit 13 comprises a TCP determination circuit 30, adder 32, RF linear interpolation circuit 35, and IF linear interpolation circuit 37. TCP data is input to the TCP determination circuit 30. The output from the TCP determination circuit 30 is input to the adder 32 and added to the current transmission output value. The output value added by the adder 32 is input to the RF linear interpolation circuit 35 and IF linear interpolation circuit 37.

The output terminal of the RF linear interpolation circuit 35 is connected to the gain control terminal of the RF-GCA 24. The output terminal of the IF linear interpolation circuit 37 is connected to the gain control terminal of the IF-GCA 20. The RF linear interpolation circuit 35 and IF linear interpolation circuit 37 individually control the RF-GCA 24 and IF-GCA 20, respectively.

An analog signal input from a microphone 6 is input to a codec 8, converted into a digital signal by the codec 8, and input to a DSP 10. The DSP 10 encodes the digital signal and inputs the signal to an HPSK circuit 14. The transmission data HPSK-modulated by the HPSK circuit 14 is input to a D/A converter 16.

The D/A converter 16 converts the digital signal into an analog baseband signal. The analog baseband signal is input to the MOD 18 to be modulated into the IF band. The output terminal of a MOD 18 is connected to the IF-GCA 20 for amplifying the signal to a predetermined level. The output terminal of the IF-GCA 20 is connected to the up converter 22 for converting the signal into a transmission frequency (RF: Radio Frequency).

The output terminal of the up converter 22 is connected to the RF-GCA 24 for converting the signal to a predetermined level. The output terminal of the RF-GCA 24 is connected to a power amplifier 26 for further amplifying the signal to the transmission output level. The power amplifier 26 is connected to the antenna 50 for transmitting the signal into air.

The GCA control circuit 13 will be described next in detail. When TCP data is input from the RAKE circuit 64 to the TCP determination circuit 30 in the GCA control circuit 12, the TCP determination circuit 30 executes determination in accordance with a predetermined protocol logic value, e.g., "1 Db up" for TCP data "00", "1 Db down" for "11", or "hold" otherwise.

The result determined by the TCP determination circuit 30 is input to the adder 32 and added to the current output value. For example, when the current transmission output value is "+10 dBm", and the TCP determination result is "+1 Db down", the next SLOT transmission output value is determined as "+9 dBm". The transmission output value output from the adder 32 is input to the RF linear interpolation circuit 35 and IF linear interpolation circuit 37.

The output terminal of the RF linear interpolation circuit 35 is connected to the gain control terminal of the RF-GCA 24. On the other hand, the output terminal of the IF linear interpolation circuit 37 is connected to the gain control terminal of the IF-GCA 20. Control signals are sent from the RF linear interpolation circuit 35 and IF linear interpolation circuit 37 to independently control the RF-GCA 24 and IF-GCA 20, respectively.

Figure 4:
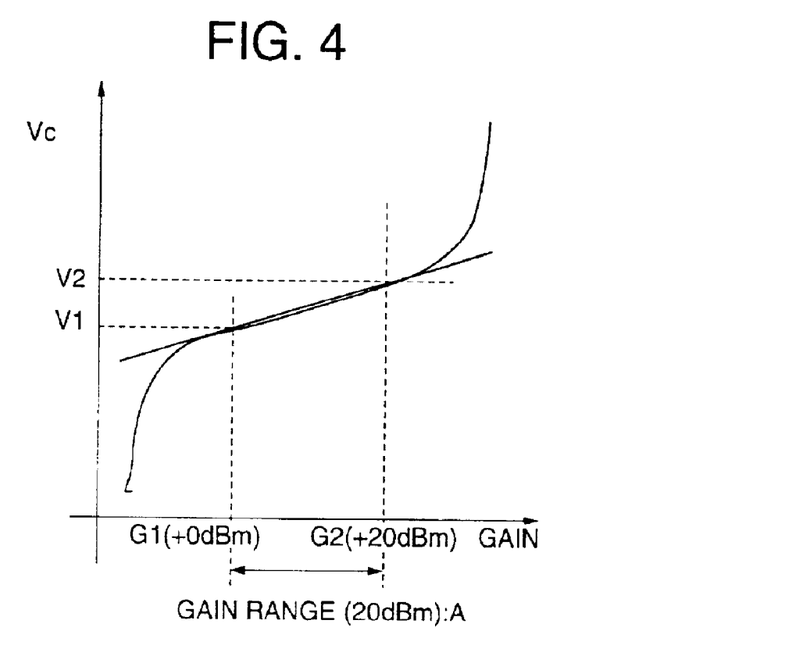
FIG. 4 is a graph showing the linear characteristic of an RF-GCA.
Figure 5:
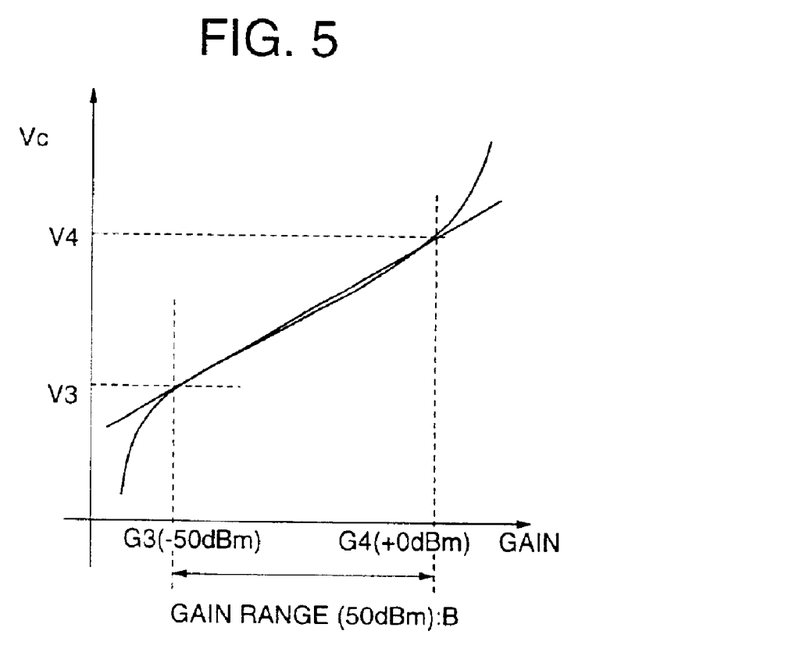
FIG. 5 is a graph showing the linear characteristic of an IF-GCA.

For example, when in a transmission circuit which requires a transmission output range of 70 Db from −50 to +20 dBm, the RF-GCA 24 has the characteristic shown in FIG. 4, and the IF-GCA 20 has the characteristic shown in FIG. 5, a range of 20 Db from +0 to +20 dBm is controlled in a linear region A (20 Db) of the RF-GCA 24, and a range of 50 Db from −50 to +0 dBm is controlled in a linear region B (50 Db) of the IF-GCA 20.

In this case, for the gain vs. Vc characteristic shown in FIG. 4, the RF linear interpolation circuit 35 defines the gains of the RF-GCA 24 as G1 (=+0 dBm) and G2 (=+20 dBm) and stores Vc (V1 and V2) corresponding to the gains as linear interpolation table values, thereby calculating Vc corresponding to the transmission output value in the range of +0 dBm to +20 dBm, which is output from the adder 32. For a value smaller than the transmission output +0 dBm, the RF linear interpolation circuit 35 operates with the fixed gain G1.

Figure 6:
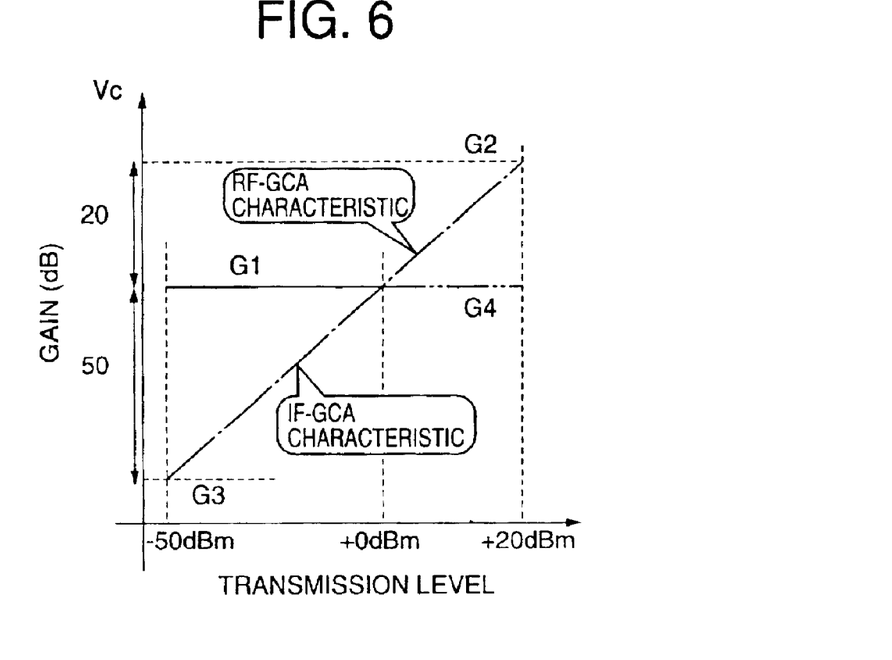
FIG. 6 is a graph showing the amplification characteristic of an IF linear interpolation circuit.

Similarly, for the gain vs. Vc characteristic shown in FIG. 5, the IF linear interpolation circuit 37 defines the gains of the IF-GCA 20 as G3 (=−50 dBm) and G4 (=+0 dBm) and stores Vc (V3 and V4) corresponding to the gains as linear interpolation table values, thereby calculating Vc corresponding to the transmission output value in the range of −50 dBm to +0 dBm, which is output from the adder 32. For a value equal to or larger than the transmission output +0 dBm, the IF linear interpolation circuit 37 operates with the fixed gain G4. This is shown in FIG. 6.

Generally, the noise amount can be calculated from the G (Gain) and NF (Noise Figure) of each device. Letting Sin/Nin be the Signal/Noise amount input to the device, Sout/Nout be the Signal/Noise amount output from the device, and Nth be the thermal noise amount in the band, SNR (Signal to Noise Ratio) is given by $$SNR = Sout/Nout = Sin * G/(Nin * G + Nth * G * (NF-1))$$

This equation indicates that as Nin/Nth (*Nin≧Nth) becomes closer to 1, the SNR degrades. That is, in a plurality of amplifiers cascade-connected, when the former stage has a high gain, the SNR at the latter stage generally becomes high.

Hence, when the control range is separated, and the RF-GCA 24 at the latter stage is controlled by a circuit for a larger transmission output while the IF-GCA 20 at the former stage is controlled by a circuit for a smaller transmission output, the SNR improves in the entire transmission output range.

As described above, the RF-GCA 24 and IF-GCA 20 can independently have their control ranges. Even when a GCA having an arbitrary characteristic is used, the linear interpolation circuit and the like can easily be designed by using an arbitrary linear region of the gain vs. Vc characteristic of the GCA.

Figure 8:
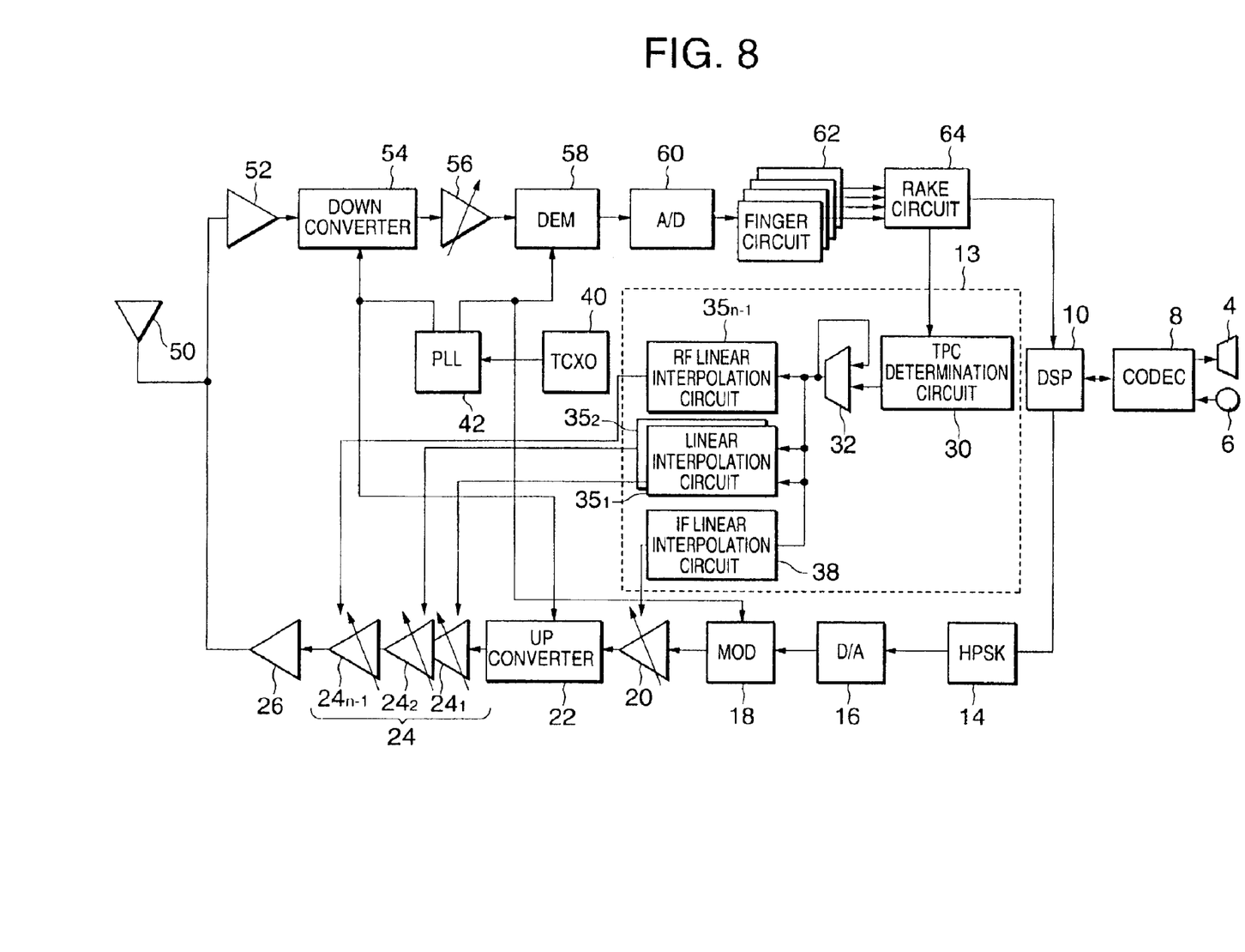
FIG. 8 is a block diagram schematically showing the arrangement of a gain control amplification circuit according to still another embodiment of the present invention.

FIG. 8 is a block diagram showing of a gain control amplification circuit according to the third embodiment of the present invention.

In the third embodiment, when a wide transmission output control range is necessary, GCAs 20, $24_1$, $24_2$, ..., $24_{n-1}$ of a plurality of stages, i.e., N stages (two or more stages) are provided, and N linear interpolation circuit $35_1$, $35_2$, ..., $35_{n-1}$, and 38 are arranged in correspondence with the GCAs, respectively, thereby realizing the same effect as described above. In this case, GCAs 24 of a plurality of stages are preferably set on the output side of an up converter 22. However, the present invention is not limited to this.

In each of the above-described embodiments, the transmission circuit of a CDMA terminal equipment has been exemplified. However, the present invention is not limited to this example.

What is claimed is:

1. A gain control amplification circuit for a terminal equipment in a radio communication system which executes communication between a base station and the terminal equipment, comprising:

a gain control amplification section having gain control amplifiers of at least two stages; and control means for controlling said gain control amplifiers, wherein said gain control amplifiers are individually controlled by said control means to set a transmission output value from the terminal equipment to a predetermined value on the basis of a reception level of a reception signal transmitted from the base station and received by the terminal equipment; and wherein said control means comprises a determination circuit for determining an intensity of the reception signal, an adder for calculating a control signal on the basis of a determination result from said determination circuit, and a control voltage generation circuit for controlling said gain control amplifiers on the basis of the control signal.

2. The circuit according to claim 1, wherein said gain control amplifiers are of IF-GCA and RF-GCA stages, a range of a gain control amplifier at a latter stage is set wider than that at a former stage.

3. The circuit according to claim 1, wherein out of said gain control amplifiers of two stages, a range of a gain control amplifier at a latter stage is set wider than that at a former stage.

4. The circuit according to claim 1, wherein when the transmission output is to be reduced, the gain of a gain control amplifier at a latter stage is reduced first.

5. The circuit according to claim 1, wherein said control voltage generation circuit is a linear interpolation circuit.

6. The circuit according to claim 5, wherein a predetermined portion of a linear characteristic in said linear interpolation circuit is used by each of said gain control amplifiers.

7. The circuit according to claim 6, wherein the predetermined portion of the linear characteristic in said linear interpolation circuit is set on the basis of an SNR of the transmission output.

8. The circuit according to claim 5, wherein said linear interpolation circuit stores a conversion value between a level of the reception signal and a gain corresponding to the level.

9. The circuit according to claim 1, wherein said gain control amplifiers of two stages are arranged on an input side (former stage) and an output side (latter stage) of an up converter in the transmission circuit.

10. The circuit according to claim 1, wherein said gain control amplifiers comprise at least three stages.

11. The circuit according to claim 1, wherein the radio communication system uses a CDMA (Code Division Multiple Access) scheme.

12. A terminal equipment in a radio communication system, which has a reception circuit for receiving a transmission signal from a base station, and a transmission circuit for transmitting a signal to the base station so as to communicate with the base station, comprising:

a gain control amplification circuit having a gain control amplification section in which gain control amplifiers of at least two stages are arranged; and control means for individually controlling said gain control amplifiers, wherein said gain control amplifiers are individually controlled by said control means to set a transmission output value from said terminal equipment to a predetermined value on the basis of a reception level of a reception signal transmitted from the base station and received by said terminal equipment, and wherein said control means comprises a determination circuit for determining an intensity of the reception signal, an adder for calculating a control signal on the basis of a determination result from said determination circuit, and a control voltage generation circuit for controlling said gain control amplifiers on the basis of the control signal.

* * * * *